US012607660B2

(12) United States Patent　　(10) Patent No.:　US 12,607,660 B2
Riedmann　　(45) Date of Patent:　Apr. 21, 2026

(54) CONFIGURABLE RADIO FREQUENCY SYSTEM

(71) Applicant: Rohde & Schwarz GmbH & Co. KG, Munich (DE)

(72) Inventor: Nico Riedmann, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 60 days.

(21) Appl. No.: 18/739,415

(22) Filed: Jun. 11, 2024

(65) Prior Publication Data

US 2025/0130261 A1　　Apr. 24, 2025

(30) Foreign Application Priority Data

Oct. 19, 2023　(EP) .................................... 23204523

(51) Int. Cl.
　　G01R 29/08　　(2006.01)
(52) U.S. Cl.
　　CPC ..... G01R 29/0871 (2013.01); G01R 29/0814 (2013.01); G01R 29/0878 (2013.01)
(58) Field of Classification Search
　　CPC ............ G01R 29/0871; G01R 29/0814; G01R 29/0878
　　See application file for complete search history.

(56) References Cited

U.S. PATENT DOCUMENTS

2004/0010384 A1　1/2004　Jacobsen et al.
2004/0201383 A1　10/2004　Anderson

2006/0282723 A1　12/2006　Pleasant et al.
2014/0080527 A1*　3/2014　Croyle ................. H04B 1/3827
　　　　　　　　　　　　　　　　455/500
2016/0204881 A1*　7/2016　Chung ................... H04B 17/00
　　　　　　　　　　　　　　　　455/67.14
2016/0259700 A1　9/2016　Volkmann et al.

(Continued)

FOREIGN PATENT DOCUMENTS

CN　　103592547 A　　2/2014
CN　　205992026 U　　3/2017
GB　　2 409 049 A　　6/2005

OTHER PUBLICATIONS

Horibe, Masahiro et al.; "Consideration of Error Model with Cable Flexure Influences on Waveguide Vector Network Analyzers at submillimeter-wave frequency"; 2015 85th Microwave Measurement Conference (ARFTG); IEEE; May 22, 2015; DOI: 10.1109/ARFTG.2015.7162906; [retrieved on Jul. 17, 2015]; pp. 1-8.

(Continued)

*Primary Examiner* — Henry Luong
(74) *Attorney, Agent, or Firm* — Studebaker Brackett PLLC

(57)　　　　　　ABSTRACT

The invention relates to a configurable radio frequency, RF, system, which comprises a first RF module; and a second RF module. Each of the first and the second RF module comprises: an RF circuitry, a signal path, in particular a waveguide, and an RF port connected to the respective RF signal path; wherein the RF port of the first RF module and the RF port of the second RF module are spaced apart at a predetermined distance and are oriented to enable a connection to a third RF module of the configurable RF system.

13 Claims, 4 Drawing Sheets

(56)                References Cited

U.S. PATENT DOCUMENTS

2019/0219612 A1      7/2019  Holzmann et al.

OTHER PUBLICATIONS

Rohde & Schwarz; "R&S ZVA Vector Network Analyzer High performance up to 110 GHz with up to four test ports"; Dec. 1, 2017; Retrieved from the Internet: URL:https://scdn.rohde-schwarz.com/ur/pws/dl_downloads/dl_common_library/dl_brochures_and_datasheets/pdf_1/ZVA_bro_en_5213-5680-12_v1300.pdf; [retrieved on Apr. 4, 2024]; pp. 1-32.

Rohde & Schwarz; "New Vector Network Analyzer Masters Complex Measurements"; Microwave Journal; May 14, 2019; Retrieved from the Internet: URL: https://www.microwavejournal.com/articles/32239-new-vector-network-analyzer-masters-complex-measurements; pp. 1-11.

Dreamcatcher; "ME1000 RF Circuit Design Courseware Out-of-Box Teaching Solution for the RF Circuit Design Quick Start Guide"; Dec. 28, 2009; Retrieved from the Internet: URL: https://biblus.us.es/bibing/proyectos/abreproy/12182/fichero/anexos%2FStartGuide.pdf; [retrieved on Apr. 2, 2024]; pp. 1-23.

Turkmen, Esref et al.; "A SiGe BiCMOS W-Band Single-Chip Frequency Extension Module for VNAs"; IEEE Transactions on Microwave Theory and Techniques; IEEE; USA; vol. 68, No. 1; Dec. 19, 2019; ISSN: 0018-9480; DOI: 10.1109/TMTT.2019.2948331; [retrieved on Jan. 14, 2020]; pp. 211-221.

Hirobe, Masahiro et al.; "Vector Network Analyzer Calibration for Characterization of Packaged Power MOSFET Device at RF Frequency"; 2020 95th ARFTG Microwave Measurement Conference (ARFTG); IEEE; Aug. 4, 2020; DOI: 10.1109/ARFTG47271.2020.9241368; pp. 1-4.

Extended European Search Report issued in EP 23204523.7-1001 by the European Patent Office on Apr. 11, 2024.

* cited by examiner

CONFIGURABLE RADIO FREQUENCY SYSTEM

TECHNICAL FIELD OF THE INVENTION

The invention relates to a configurable RF system, in particular a frontend system for a test and/or measurement device such as a spectrum analyzer or a signal generator.

BACKGROUND OF THE INVENTION

Test and/or measurement devices, such as spectrum or network analyzers, can be used for characterizing so called devices-under-test (DUTs). The DUTs can be waveguide modules or substrate-based circuits, e.g. MMICs (Monolithic Microwave Integrated Circuits), which operate with millimeter wave (mmW) signals. In case of an MMIC, various measurements are often carried out at different test points in the circuit.

Depending on the type of the characterization measurement and the parameters to be measured, different measurement devices and frontends (e.g., mmW converters) are thereby used.

For instance, in case of low or high signal S-parameter measurements or measurements of certain wave-parameters of an mmW DUT, a network analyzer and two mmW converters may be used. Often, an additional amplifier is connected to the setup, as the output power of the mmW converters may not be sufficient for many measurements. This can, however, reduce the directivity of the mmW converters, i.e. the DUT can no longer be characterized with respect to the input reflection coefficient. In addition, the source signal may no longer be measurable via the directional coupler. Thus, the amplifier is not used for all measurements.

For noise measurements, in contrast, a network analyzer and two mmW converter or a spectrum analyzer, a mixer, and a noise source may be used; and for linearity measurements, a network analyzer and two or three mmW converters may be used. For measuring other parameters and signals (e.g., EVM, IQ charts, RF spectra, modulated signals, etc.), additional devices and frontends (e.g., vector signal generators) might be required.

Thus, a measurement setup often has to be changed when performing new measurements. For instance, external frontends are swapped or additional devices are connected. This is cumbersome and time consuming. Further, a new calibration of the setup is often repeated every time the setup is changed, causing additional efforts.

Thus, it is an objective to provide a configurable RF system which avoids the above mentioned disadvantages.

SUMMARY OF THE INVENTION

The object of the present invention is achieved by the solution provided in the enclosed independent claims. Advantageous implementations of the present invention are further defined in the dependent claims.

According to a first aspect, the invention relates to a configurable radio frequency (RF) system. The configurable RF system comprises: a first RF module, and a second RF module. Each of the first and the second RF module comprises: an RF circuitry; a signal path, in particular a waveguide; and an RF port connected to the respective signal path; wherein the RF port of the first RF module and the RF port of the second RF module are spaced apart at a predetermined distance and are oriented to enable a connection to a third RF module of the configurable RF system.

This achieves the advantage that a configurable RF system is provided which can be used together with different test and/or measurement devices. The RF system can be a frontend system, which is connected between the test and/or measurement device (e.g., a network analyzer, a signal generator or a spectrum analyzer) and a device-under-test (DUT) and which can forward RF signals between these devices.

In particular, the configurable RF system provides a universal usability (i.e., it can be used with different test/measurement devices and for different measurements) and, thus, reduces the number of frontends required by a user. This also saves the time that is required for a conversion of a conventional measurement setup with different frontends.

The RF system can be suitable for RF signals in an mmW wavelength range (mmW signals). Thus, the configurable RF system can form an mmW frontend system.

The signal path of the first and/or the second RF module can be an RF signal path. For example, each signal path is designed as an RF waveguide, in particular an RF waveguide for guiding mmW signals. The RF waveguides can be rectangular metallic waveguides.

The second RF module can be attached to the first RF module. For instance, the first RF module and the second RF module are attached to each other on their respective side surfaces.

For example, the first RF module and the second RF module are screwed and/or clipped together. Typically, this connection is fixed and not releasable by a user or operator of the RF system.

For example, the first RF module and the second RF module can be arranged in a common housing or within separate housings. The housing(s) can be metal housing(s).

In an embodiment, the RF port of the first and/or the second RF module comprises a waveguide flange or a coaxial interface.

In an embodiment, the first and/or the second RF module comprise a respective data interface.

This achieves the advantage that a function of the first and/or second RF module can be controlled, e.g. by the test and/or measurement device. In particular, a configuration of the first and/or second RF module can be changed in this way.

For example, the data interface is a USB interface.

In an embodiment, the first and/or the second RF module comprise a respective power supply interface.

In an embodiment, the third RF module comprises: two RF ports which are spaced apart at the predetermined distance and are designed for connecting to the RF ports of the first and the second RF module, and a further RF port which is arranged for being connected to a device-under-test, DUT.

The third RF module may further comprise a signal path which is connected: to the two RF ports that are connectable to the first/second RF module, and to the further RF port.

This achieves the advantage that the respective RF ports of the first and second RF module can be connected to a DUT, e.g. a single DUT port, via the third RF module. Thus, different measurements can be carried out with the DUT suing the first and the second RF module, without having to change the setup (e.g., without having to disconnecting the first RF module and connecting the second RF module to the DUT).

In an embodiment, the third RF module comprises at least one of: a coupler, a combiner, a splitter, a switch, an impedance tuner, and/or a multiplexer.

For instance, the third RF module is a combiner module which can combined RF signals from the first and second RF module. This combiner module can give the configurable RF system a full duplex capability when connected between the DUT and the first and second RF module.

In an embodiment, the RF circuitry of the first and/or the second RF module comprises at least one of: an RF amplifier, an RF mixer, an RF attenuator, an RF switch, an RF isolator, a combiner, a coupler, a doubler, a multiplier, a circulator, a phase shifter, and/or a delay line.

This achieves the advantage that the first and/or the second RF module may provide a plurality of different functionalities. For instance, different elements can be activated or switched into the respective signal path, e.g. based on a received control command.

In an embodiment, the first RF module is a receiver module or a transmitter module.

In an embodiment, the second RF module is a receiver module or a transmitter module.

In an embodiment, both the first and the second RF module are receiver modules.

In an embodiment, both the first and the second RF module are transmitter modules.

For instance, if an RF module is configured as a receiver module, it receives RF signals via its RF port (e.g., from a connected DUT via the third RF module) and forwards said RF signals to a test and/or measurement device. If an RF module is configured as a transmitter module, it may receive RF signals from the test and/or measurement device and forward said RF signals via the RF port to the third RF module (and a DUT).

In an embodiment, the RF ports of the first and the second RF module are arranged at the predetermined distance to each other with a tolerance of 100 μm or less.

This achieves the advantage that the RF connections between the first/second RF module and the third RF module can comply with the high requirements regarding tolerance and fitting accuracy for waveguides and their interfaces.

In particular, the distance tolerance of the RF ports is 100 μm or less when the first RF module is attached to or fixated to the second RF module.

In an embedment, the third RF module is detachably attached to the first and the second RF module.

This achieves the advantage that the RF system can be a modular system, which allow a user to connect different RF modules to the (interconnected) first and second RF module, depending on the requirements.

Preferably, the third RF module can be directly connected to the first and the second RF module without using cables. This is especially advantageous when using mmW signals that are transmitted via waveguides in the RF modules.

In an embodiment, the third RF module is attached to the first and the second RF module by means of a plug-in connection, a screw connection or a magnetic connection.

BRIEF DESCRIPTION OF THE DRAWINGS

The invention will be explained in the following together with the figures.

DETAILED DESCRIPTION OF THE PREFERRED EMBODIMENTS

Figure 1:
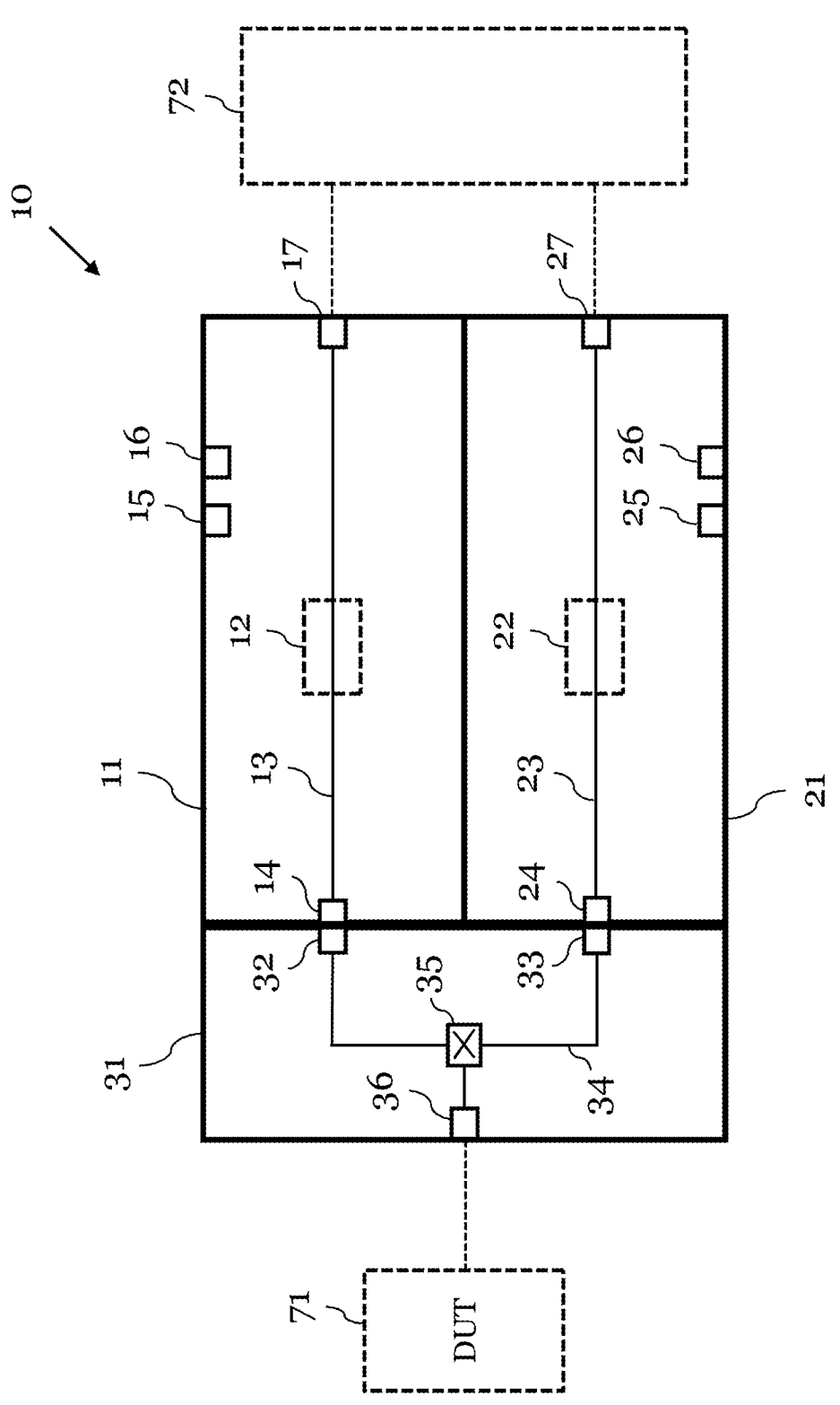
FIG. 1 shows a schematic diagram of a configurable RF system according to an embodiment.

FIG. 1 shows a schematic diagram of a configurable and/or modular RF system 10 according to an embodiment.

The RF system 10 comprises: a first RF module 11; and a second RF module 21 which is attached to the first RF module 11. Each of the first and the second RF module 11, 21 comprises: an RF circuitry 12, 22, a signal path 13, 23, in particular a waveguide, and an RF port 14, 24 connected to the respective signal path 13, 23. The RF port 14 of the first RF module 11 and the RF port 24 of the second RF module 21 are spaced apart at a predetermined a distance and oriented to enable connection to a third RF module 31 of the configurable RF system 10.

The configurable and/or modular RF system 10 can be a frontend system which is arranged between a test and/or measurement device 72 and a DUT 71. In particular, each of the first and the second RF module 11, 21 can comprise a dedicated RF port 17, 27 for connecting to a RF port of the test and/or measurement device.

The RF system 10 can be configured to forward RF signals, in particular mmW signals, between the test and/or measurement device 72 and the DUT 71.

The respective signal paths 13, 23 of the first and the second RF module 11, 21 can be designed as RF waveguides, in particular waveguides for mmW radiation. The RF waveguides can be rectangular metallic waveguides.

Each of the RF ports 14, 24, 17, 27 of the first and/or the second RF module can be designed as or can comprise a waveguide flange. Alternatively, each of these interfaces can also be designed as or comprise coaxial interfaces.

Furthermore, each of the first and/or the second RF module 11, 21 may comprise a respective data interface 15, 25. This data interface can be a USB interface.

For instance, the RF modules 11, 21 can receive control commands via the data interface. In an example, an RF module 11, 21 can activate or switch an RF element (e.g., an amplifier, an attenuator, a filter etc.) into the signal path when receiving a respective control command. In this way, the RF modules 11, 21 can be configured or adapted for a specific measurement without having to manually change the measurement setup.

The first and/or the second RF module 11, 21 may further each comprise a respective power supply interface 16, 26.

The data interfaces 15, 25 and/or the power supply interfaces 16, 26 can be connected to the test and/or measurement device 72.

Furthermore, also the third RF module 31 may comprise a data interface and/or a power supply interface. For instance, via these interfaces, the third RF module 31 can receive electrical energy, e.g. from the first or second RF module 11, 21 or from the test and/or measurement device 72 and/or can supply energy to further RF modules.

The RF circuitry 12, 22 of the first and/or the second RF module 11, 21 can be connected to the signal path 13, 23 of the respective module 11, 21 and may comprise one or more elements which are configured to adapt and/or condition RF signals that are transmitted via the signal path 13, 23. For instance, each of RF circuitries 12, 22 may comprises at least one of: an RF amplifier, an RF mixer, an RF attenuator, an RF switch, an RF isolator, a combiner, a coupler, a doubler, a multiplier, a circulator, a phase shifter, and/or a delay line.

Each of the first and the second RF module 11, 21 can be either a receiver module (RX module) or a transmitter module (TX module). For instance, a receiver module comprises a receiver or receiver circuitry and is configured to receive an RF signal via the RF port, and a transmitter module comprises a transmitter or transmitter circuitry and is configured to transmit an RF signal via the RF port.

In an example, the first RF module 11 is an RX module and the second RF module 21 is a TX module, or vice versa. In this way, a frontend with both RX and TX capabilities can be provided.

The test and/or measurement device 72 can be a device which generates signals and forwards them to the RF system 10 (e.g., a signal generator or VNA) or a device which receives signals from the RF system (e.g., a spectrum or network analyzer). A configurable RF system 10, which comprises an Rx and a Tx receiver, can be used as a frontend system for both of these types of devices.

For instance, the RF port of the TX module (which forms an output port) and the RF port of the RX module (which forms an input port) can be connected to the third RF module 31 (e.g., without opening the modules). The third RF module 31 can then selectively connect any one of these ports 14, 24 with the DUT 71.

Alternatively, both the first and the second RF module 11, 21 can be either Rx or Tx modules.

The third RF module 31 may comprise at least three RF ports 32, 33, 36. The three RF ports 32, 33, 36 can be designed as or can comprise waveguide flanges.

In particular, the third RF module 31 comprises two RF ports 32, 33 which are spaced apart at the predetermined distance and are designed for connecting to the RF ports 14, 24 of the first and the second RF module 11, 21, and a further RF port 36 which is arranged for being connected to the DUT 71.

The third RF module may further comprise at least one element 35 which connects to the three RF ports 32, 33, 36 via a signal path 34, in particular a waveguide (e.g., a rectangular metallic waveguide).

The at least one element 35 can comprise a switch, for instance a mechanically or electrically controllable switch, a coupler, a combiner, a splitter, or a multiplexer.

The third RF module 31, can be configured to switch the RF ports 14, 24 of the first and second RF module 11, 21 to a single further port 36, which can be connected to the DUT.

For instance, if the first and the second RF module 11, 21 are an Rx and a Tx module, respectively, than the third RF module 31 can selectively switch its further RF port 36 (that can be connected to a DUT) to the Rx or the Tx module. In this way, a half-duplex system can be released. If the element 35 is instead a coupler, a combiner or a splitter, the system 10 can even form a full-duplex system.

If the first and the second RF module 11, 21 are both Tx modules, the third RF module 31 can generate a two-tone signal by combining respective RF signals received via the RF ports 32, 33.

The third RF module 31 may comprise further functionality, such as a digital interface with characterization data stored in the module for signal correction, transmission or reflection measurements (as a function of frequency).

For instance, the third RF module 31 may further comprise a digital data storage which is configured to store device data referring to the third RF module 31. The data storage can be coupled to the digital interface (e.g., a data interface) of the third RF module 31, wherein the digital interface is adapted to couple the third RF module 31 with an external communication partner (e.g., the test and/or measurement device). For example, the device data stored in the digital data storage may comprise a unique identifier for the third RF module 31 and/or data characterizing the RF signal path 34 and the RF port(s) 32, 33, 36 of the third RF module 31. The digital data storage may further receive control data for controlling the third RF module 31 and/or updated device data via the digital interface. The updated device data can be store the updated device data.

The third RF module 31 can be detachably attached to the first and the second RF module 11 21. For example, the third RF module 31 can be attached to the first and the second RF module 11, 21 by means of a plug-in connection, a screw connection or a magnetic connection.

In an example, this connection is established by screwing the respective waveguide flanges of the RF ports 14, 24 of the first and second RF module 11, 21 to the flanges of the complementary RF ports 32, 33 of the third RF module 31.

In addition, the third RF module 31 can be removed from the first and the second RF module 11, 21 to use the first and second RF modules 11, 21 separately and/or to improve the performance of these modules 11, 21 (e.g., by reducing an attenuation of both modules). In this way, for example, a noise figure of an Rx module and an output power of a Tx module can be improved.

Furthermore, the RF system 10 may comprise an external multiplexer module. This external multiplexer module can be used instead of or in addition to the third RF module 31 and can enable switching between a plurality of further RF ports of the third RF module 31, e.g. a number of input and output ports for connecting to one or more DUTs. These further RF ports can be bidirectional ports. For instance, multiple DUTs could be connected to the further RF ports, e.g. two or more antennas for OTA measurements with cross and co-polarization.

For example, the third RF module 31 may comprise an active or passive impedance tuner. The impedance tuner can allow a user to adapt an impedance value and to carry out impedance specific measurements. For instance, source and/or load pull measurements can be carried out in this way without having to connect additional external impedance tuners.

The first and the second RF modules 11, 21 can be arranged at a well-defined distance and orientation to each other and can be attached to each other (e.g., screwed to each other). As a consequence the RF ports 14, 24 of the first and second RF module 11, 21 can be spaced apart at the predetermined distance and orientation with a high tolerance of 100 μm or less. This is high tolerance is especially important when the RF ports 14, 24 are waveguide-interfaces (e.g., waveguide flanges) which should be aligned as precisely as possible (i.e., without offset) to the complementary RF ports 32, 33 of the third RF module 31, when the third RF module 31 is attached to the first and the second RF module 11, 21.

For instance, the alignment of the RF ports 14, 24 of the first and second RF module 11, 21 fulfills the requirements for the max. allowed misalignment according to IEEE Std 1785.2-2016.

The first and the second RF module 11, 21 can thereby be firmly connected or even housed in the same housing (e.g., of a remote measurement head or module). Different third RF modules 31 (with different functionalities) can be removably attached to the thus combined first and second RF modules 11, 21, resulting in a modular frontend system. In this way, the RF ports 14, 24 (e.g., Rx and Tx ports) of the first and second RF module 11, 21 can be accessible to the user.

Figure 2:
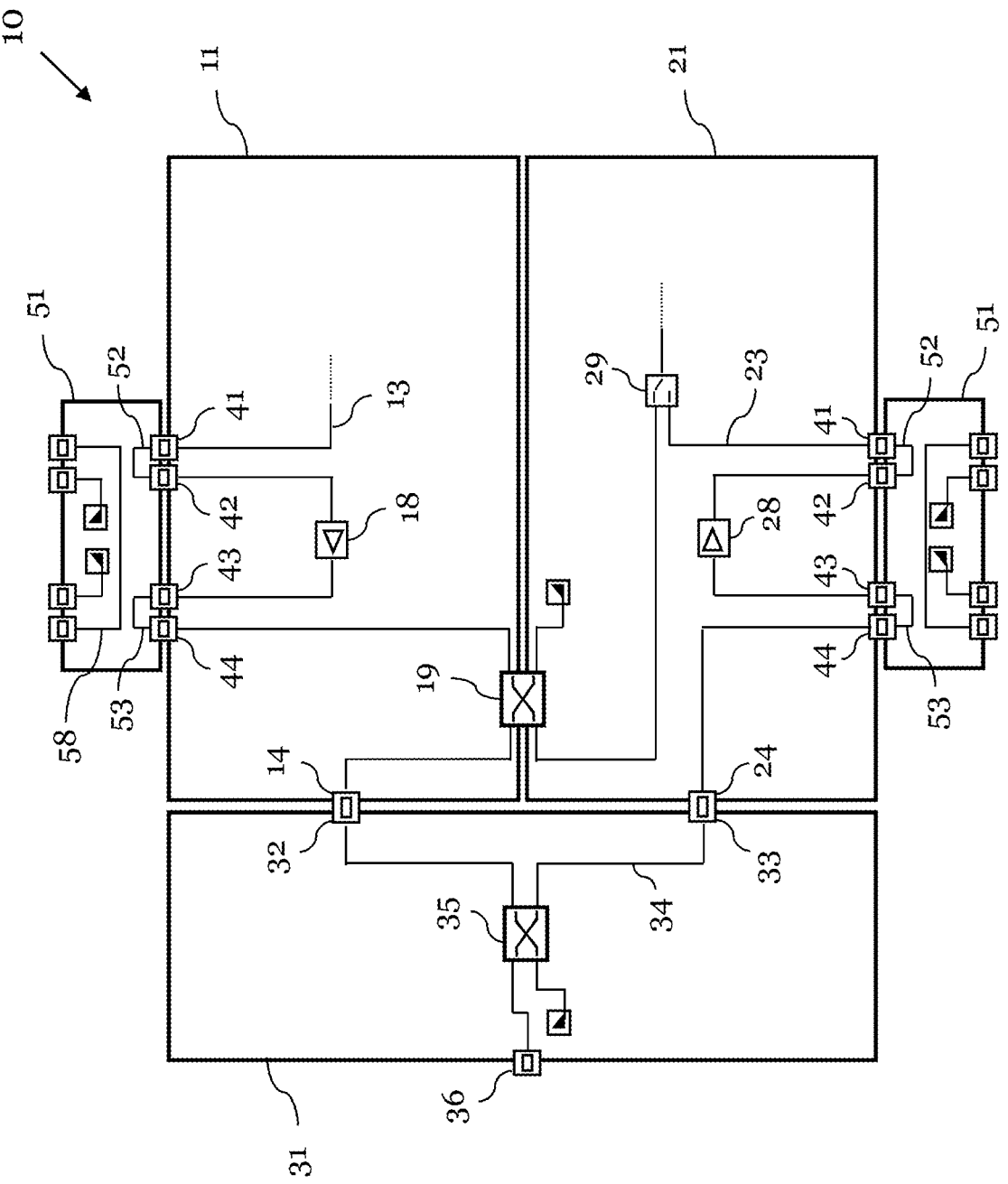
FIG. 2 shows a schematic diagram of a configurable RF system according to an embodiment.

FIG. 2 shows a schematic diagram of the configurable RF system 10 according to an embodiment. The system 10 shown in FIG. 2 can be identical to the system shown in FIG. 1.

The configurable RF system 10 shown in FIG. 2 comprises the first RF module 11 which comprises the signal path 13 and the RF port 14; wherein the RF port 14 can be arranged for being connected to a further RF module (e.g., the third RF module 31) or to the DUT. The first RF module 11 may further comprise at least a first and a second auxiliary port 41, 42 which are accessible from outside the first RF module 11; wherein the first and the second auxiliary port 41, 42 are arranged for being connected to each other via: a first bridging element 52 or a first extension module 51 of the configurable RF system 10. The signal path 13 may be connected to the RF port 14 and pass through the first auxiliary port 41, and may further pass through the first bridging element 52 or the first extension module 51. The signal path 13 can further pass through the second auxiliary port 42.

As shown in FIG. 2, the first RF module 11 may further comprise at least a third and a fourth auxiliary port 43, 44 which are also accessible from outside the first RF module 11. Also, this third and fourth auxiliary ports 43, 44 can be arranged for being connected to each other via: a second bridging element 43, or the first extension module 51, or a second extension module (not shown) of the configurable RF system. As shown in FIG. 2, the signal path 13 of the first RF module 11 may pass through said third auxiliary port, and may further pass through the second bridging element 53 or the first extension module 51 or the (not shown) second extension module. Further, the signal path 13 may pass through the fourth auxiliary port 44.

The auxiliary ports 41, 42, 43, 44 can form an interface of the first RF module for connecting the first extension module 51 and/or the bridging element(s) 52, 53. In this way, the signal path can be "guided" out of the RF module 11 and into the extension module 51, where additional signal processing or conditioning steps can be carried out.

The system 10 shown in FIG. 2, further comprises the second RF module 21 which comprises a (further) signal path 23 and a (further) RF port 24 which is arranged for being connected to the further (i.e., third) RF module 31 or to the DUT.

The second RF module 21 may have a partially equivalent design to the first RF module 11, and may also comprise: at least a (further) first and a (further) second auxiliary port 41, 42 which are accessible from outside the second RF module 21, wherein the (further) first and the (further) second auxiliary port 41, 42 are arranged for being connected to each other via: a (third) bridging element 52 or a (third) extension module 51 of the configurable RF system 10. The further signal path 23 may be connected to the further RF port 24 of the second RF module 21 and pass through the (further) first auxiliary port 41, and further pass through the (third) bridging element 52 or the (third) extension module 51. The further signal path 23 may further pass through the further second auxiliary port 44.

Similar to the first RF module 11, also the second RF module 21 may comprise (further) third and fourth auxiliary ports 44, 43 which are accessible from outside the second RF module 21. The (further) third and fourth auxiliary ports 44, 43 can be arranged for being connected to each other via: a (fourth) bridging element 53, or the (third) extension module 51, or a fourth extension module (not shown). The further signal path 53 can pass through the further third auxiliary port 43, and can further pass through the fourth bridging element 53, or the third extension module 51 or the fourth extension module. The further signal path 23 can further pass through the further fourth auxiliary port 44.

The respective signal path 13, 23 of the first and/or the second RF module 11, 21 can be RF signal paths. For example, the respective signal paths 13, 23 are designed as RF waveguides, in particular waveguides for guiding mmW radiation. The RF waveguides can be rectangular metallic waveguides.

Each of the RF ports and/or auxiliary ports 14, 24, 41, 42, 43, 44 of the first and/or the second RF module 11, 21 can be or can comprise waveguide flanges. Alternatively, each of these interfaces can also be coaxial interfaces.

For example, the first RF module 11 can be a transmitter (Tx) module and the second RF module 21 can be a receiver (Rx) module. Alternatively, also both RF modules 11, 21 can be Rx or Tx modules.

The first RF module 11 and the second RF module 21 can be arranged in a common housing or within separate housings.

For instance, the first and the second RF module 11, 21 can be screwed and/or clipped together. Alternatively or additionally, the configurable RF system 10 comprises a data connection and/or a supply voltage connection which connects the first RF module 11 with the second RF module 21.

Furthermore, a coupling element 19 can be arranged at an interface of the first and the second RF module 11, 21 and can be connected to the respective signal paths 13, 23 of the modules 11, 21. For instance, via this coupling element 19 at least a part of an RF signal can be coupled from a signal path of one RF module to the signal path of the other RF module.

For instance, in this way a Tx signal could be coupled from the Tx module (e.g., in FIG. 2 the first module 11) to the Rx module (e.g., in FIG. 2 the second module 21). A switch in the second module 21 can be arranged to selectively forward the thus received Tx signal portion or an Rx signal received via the RF port 24 to a connected test and/or measurement device.

For instance, in an Rx/Tx arrangement, the coupled out signal part can be used as a reference receiver signal for a VNA (vector network analyzer) frontend or for analyzing the output signal of the Tx module (e.g., for digital pre-distortion of a modulated/broadband TX signal). In a Tx/Tx arrangement, this connection allows a combining of two signal sources for generating a two- or more-tone signal.

The coupling element 19 can be a coupler, a combiner, a splitter or a switch. The coupling element 19 can be arranged in or at a connection surface of the first and the second RF module 11, 21.

As shown in FIG. 2, the respective signal paths 13, 23 of the first and/or the second RF module 11, 21 can be arranged such that at least a part of the signal path 13, 23 between the first and fourth auxiliary port 41, 44 loops through the first respectively second RF module 11, 21.

For instance, an electronic device 18, 28, such as an amplifier unit or an attenuator unit, can be arranged in the first and/or second RF module, such that the part of the signal path 13, 23 (that loops through the RF module) passes through the electronic device 18, 28. For instance, in this way, an RF signal transmitted by or received by an RF module 11, 21 can be amplified or attenuated. The electronic device can be a component of the RF circuitry 12, 22.

The first RF module 11 and/or the second RF module 21 may comprises a plurality of sub-modules. For example, each sub-module comprises two of the auxiliary ports 41, 42, 43, 44. Each sub-module can have a separate housing.

Preferably, the extension modules 51, which can be connected to the first and/or second RF module 11, 21 via the auxiliary ports 41-44 expand the functionality of the RF modules 11, 21.

For instance, each of the extension modules 51 may comprises at least one of the following elements: an amplifier stage, a switching unit configured to connect at least one of the auxiliary ports to another auxiliary port, an attenuator unit, a filter unit, a phase shifter, an isolator, a circulator, a power detector, a mixer, a signal and/or noise source, a modulator, a coupler unit, a splitter, and/or a combiner.

Furthermore, the bridging elements 52, 53, which can be bridge-like elements that directly connect two auxiliary ports, may be comprised by the extension modules (as shown in FIG. 2).

In this way, a user or operator can easily adapt and/or configure the RF system 10 by connecting a suitable extension module 51 to any one of the RF modules 11, 21. For instance, different extension modules 51 can be connected to the first and the second RF module 21 depending on the measurement requirements. Thus, the RF system 10 can be modular system that can be quickly adapted by connecting suitable extension modules 51.

Note that the extension modules 51 connected to both RF modules 11, 21 in FIG. 2 are only an example. A plurality of different extension modules (as e.g. shown in FIGS. 3A-D), which offer different functionalities, can be provided and can be connected to the first and/or to the second RF module 11, 21, depending on the requirements.

Thereby, each of the extension modules 51 can be removably attached to the first respectively second RF module 11, 21, e.g. by means of a plug-in connection, a screw connection or a magnetic connection.

For example, the first extension module 51 is screwed to the first RF module 11; or the first extension module 51 and the first RF module 11 are magnetically forced together. The magnetic attachment may replace a screw connection and allows for an easy mounting/replacement of the extension module e51 without needing special tools. The (third) extension module 51 can be attached to the second RF module 21 in the same way.

Further implementation examples/approaches for attaching the extension modules 51 to the first and/or the second RF module 11, 21 may comprise: a toggle press, a snap lock, a clamping device based on rotation, or a hand screw or knob.

In general, the first and/or second RF module 11, 21 comprises at least one auxiliary port 41-44 which is connected to the respective signal path 13, 23 of the module 11, 21. This auxiliary port can be used to couple additional RF signals into or out of the respective signal path 13, 23.

For example, the Tx module (e.g., first RF module 11 in FIG. 2) may comprise an internal switch which switches the RF port 14 between a port connected to a test and/or measurement device and one of the auxiliary ports 41-44 which receives the external signal. For example, a noise source could be connected to this auxiliary port or to the extension module 51 connected to this auxiliary port. This enables, for example, a comprehensive characterization of the DUT (e.g., chips/MMICs on a wafer prober system) without disconnecting the DUT and/or without modifying the measurement setup. For instance, the TX module 11 can generate and/or forward CW (continuous wave) signals and/or broadband signals, e.g. for S-parameter, large signal or linearity measurements. Furthermore, the TX module 11 could provide a noise source which can be switched on the RF port 14.

The Rx module (e.g., the second RF module 21 in FIG. 2) could comprise an additional switch which could switch an output port (connected to the test and/or measurement device) between the signal path 23 connected to the RF port 24 and an auxiliary port 41-44. For instance, an external power meter (for calibration) could be connected to this auxiliary port.

In case the first and/or second RF module 11, 21 comprise two or more auxiliary ports 41-44, as shown in FIG. 2, different external modules 51 can be connected to the first and/or second RF module 11, 21 which expand the functionality of these RF module.

For instance, the extension modules 51 can connect at least one of the following elements to a signal path of an RF module: an additional output amplifier to a TX signal path or an LNA (low noise amplifier) to an RX signal path, a mixer, a level detector, a switch, one or more attenuators, a filter, a coupler, a splitter, an isolator, a phase shifter, a circulator, a power detector, a modulator, a combiner, a load tuner, or a source tuner. In this way, a functionality and/or performance of an RF module 11, 21 can be enhanced.

If an RF module has four auxiliary ports 41-44 (as the modules 11, 21 shown in FIG. 2), a bypassing of an internal function block of the module (e.g., an external stage in a Tx module) via a selective connection of auxiliary ports with a bridging element is possible.

FIGS. 3A-D show schematic diagrams of different extension modules 51 according to an embodiment. For instance, each of the modules 51 shown in FIGS. 3A-D can be connected to the auxiliary ports 41-44 of the first and/or the second RF module 11, 21 in FIG. 2.

Figure 3A:
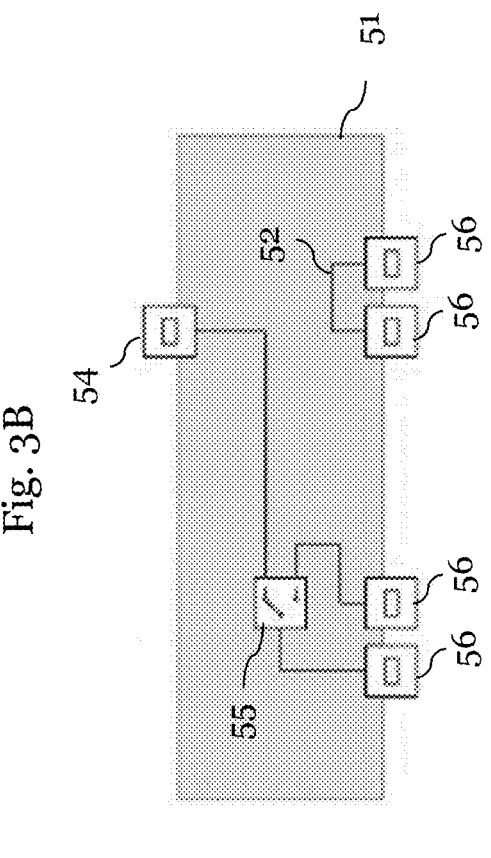
FIGS. 3A-D show schematic diagrams of different extension modules according to an embodiment.

For instance, the extension module 51 shown in FIG. 3A comprises four ports 56 which can connect to the four auxiliary ports 41-44 of the RF module(s) 11, 21. The extension module 51 further comprises electrical or mechanical controlled switches 55 which can either generate a respective bypass between the ports 56 connected to the first and second auxiliary port 41, 42, and/or between the ports 56 connected to the third and fourth auxiliary port 43, 44 of an RF module. However, the switches 55 can also connect respective external ports 54 to the first and fourth auxiliary port 41, 44. The external ports 54 could be connected to a further external module or to another element, such as a signal or a noise source. Thus, the extension module 51 in FIG. 3A can offer an electrical or mechanical controlled bypass for further external modules.

Figure 3B:
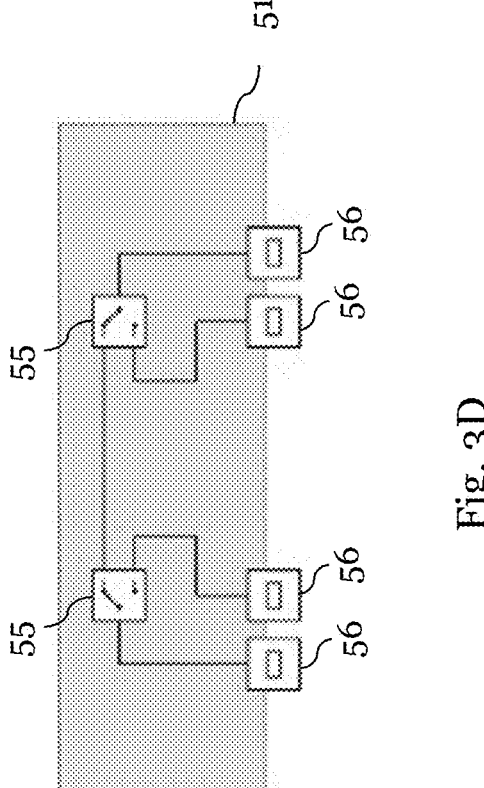

The extension module 51 shown in FIG. 3B, may also provide an electrical or mechanical controlled bypass for external sources (e.g., noise sources, signal sources). Thereby, a switch 55 can switch between a connection between two ports 51 connected to the third and fourth auxiliary port 43, 44 and a connection of the fourth auxiliary port 44 with an external port 54.

When connected to a Tx module, the external port 54 can be a feeding port configured to receive an RF signal; and the connected RF module 11 (e.g., a Tx module) can be configured to transmit the thus received RF signal to its RF port. Alternatively, when connected to an RX module, the external port 54 can be a receiving port configured to output an RF signal which is transmitted via the signal path of the Rx module.

Figure 3C:
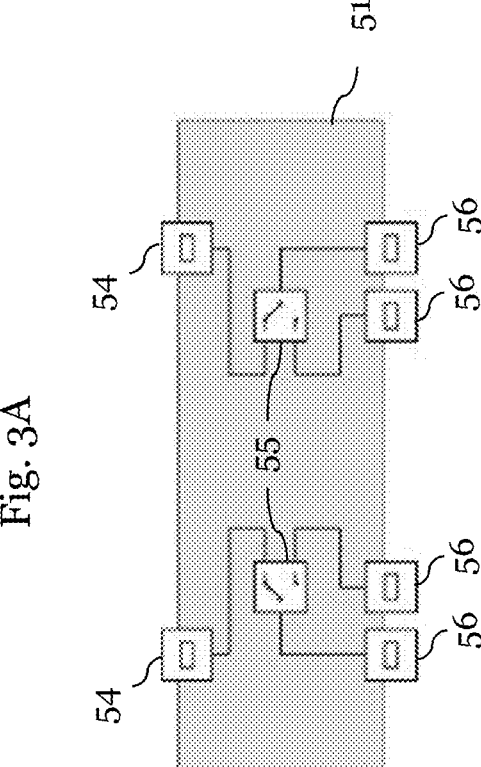

FIG. 3C shows an extension module 51 which is a high output power module. This module 51 comprises an amplifier unit 56 (e.g., comprising amplifiers) which can be inserted and/or connected to the signal path of the RF module. For instance, the extension module 51 in FIG. 3C can be connected to a Tx module to increase an output level of a Tx signal.

Alternatively, an extension module 51 could comprising an attenuator and/or an LNA, e.g. for connecting to an Rx module.

For instance, by connecting such an extension module 51 to an Rx or Tx module, the performance of the RX/Tx module can be enhanced without reducing its functionality. Thus, the RF module(s) 11, 21 do not have to be re-designed when a new DUT with higher performance requirements for the power output stage is measured.

Figure 3D:
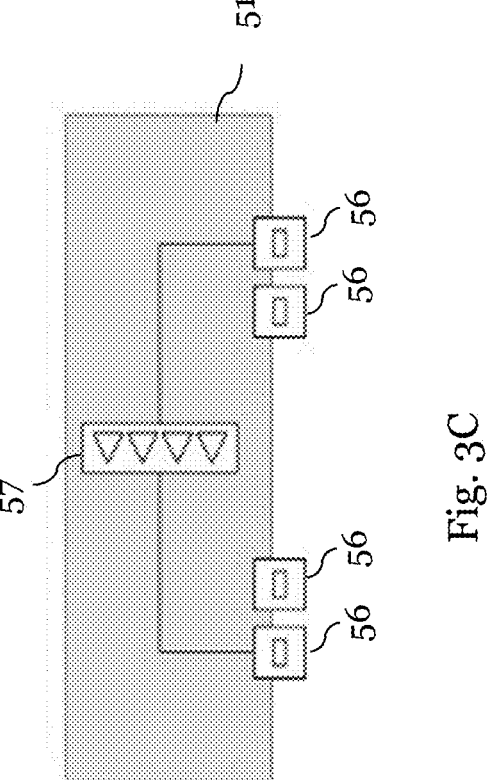

FIG. 3D shows an extensions module 51 which allows for switching between a connection to an electronic device 18, 28 (e.g., a power amplifier unit) of a connected RF module and a bridging element arranged for bypassing the electronic device 18, 28 by directly connecting the first and fourth auxiliary port 41, 44 of the RF module.

When connected to an RX module, the extension modules 51 can for instance be used to improve the performance of a low noise amplifier, to bypass an LNA to increase an input level, or to connect an additional attenuator to reduce an input level.

In case of an RF module with a plurality of auxiliary ports 41-44, preferably four auxiliary ports, which are connected to a signal path, the extension modules can be used to bypass parts of the signal path (e.g., a power amplifier in TX or LNA in RX).

Furthermore, a single extension module 51 can offer several functionalities by being design as a turnover plate, which can be dismounted for "reconfiguration", rotated around its own axis and re-mounted on the RF module.

The extension modules 51 connected to the first and second RF module 11, 21 in FIG. 2 are examples for extension modules with such turnover plate designs. For instance, in the currently mounted configuration, the extension modules 51 connect respective bridging elements 52, 53 to the first and second auxiliary ports 41, 42 and to the third and fourth auxiliary ports 43, 44 of the RF modules 11, 21. In this configuration, the electronic device 18, 28 of each module is connected to the respective signal path 13, 28.

However, when turning around and mounting the extension modules 51 via its RF ports on the opposite side, a further bridging element 58 connects the respective first and the fourth auxiliary ports 41, 44. This further bridging 58 element forms a bypass element for bypassing the electronic device 18, 28 (i.e., the electronic device is not connected to the signal path 13, 28 over with the RF signal is forwarded). In this way, the electronic device 18, 28 can be switched in or out of the signal path 13, 23.

When using more complex modules on the additional auxiliary ports 41-44, an electrically controllable switching is also possible.

Preferably, the extension modules 51 can be swapped during operation of the RF system 10. Hereby, during operation means that the DUT does not have to be disconnected (i.e., from the third RF module 31) when swapping of the extension module(s) 51.

Furthermore, the RF modules 11, 21 can be configured to automatically detect a connected extension module 51. During operation, new or other additional in the software of the RF modules 11, 21 or the test and/or measurement device can then be activated for adapting of the system 10 on-the-fly.

Figure 4:
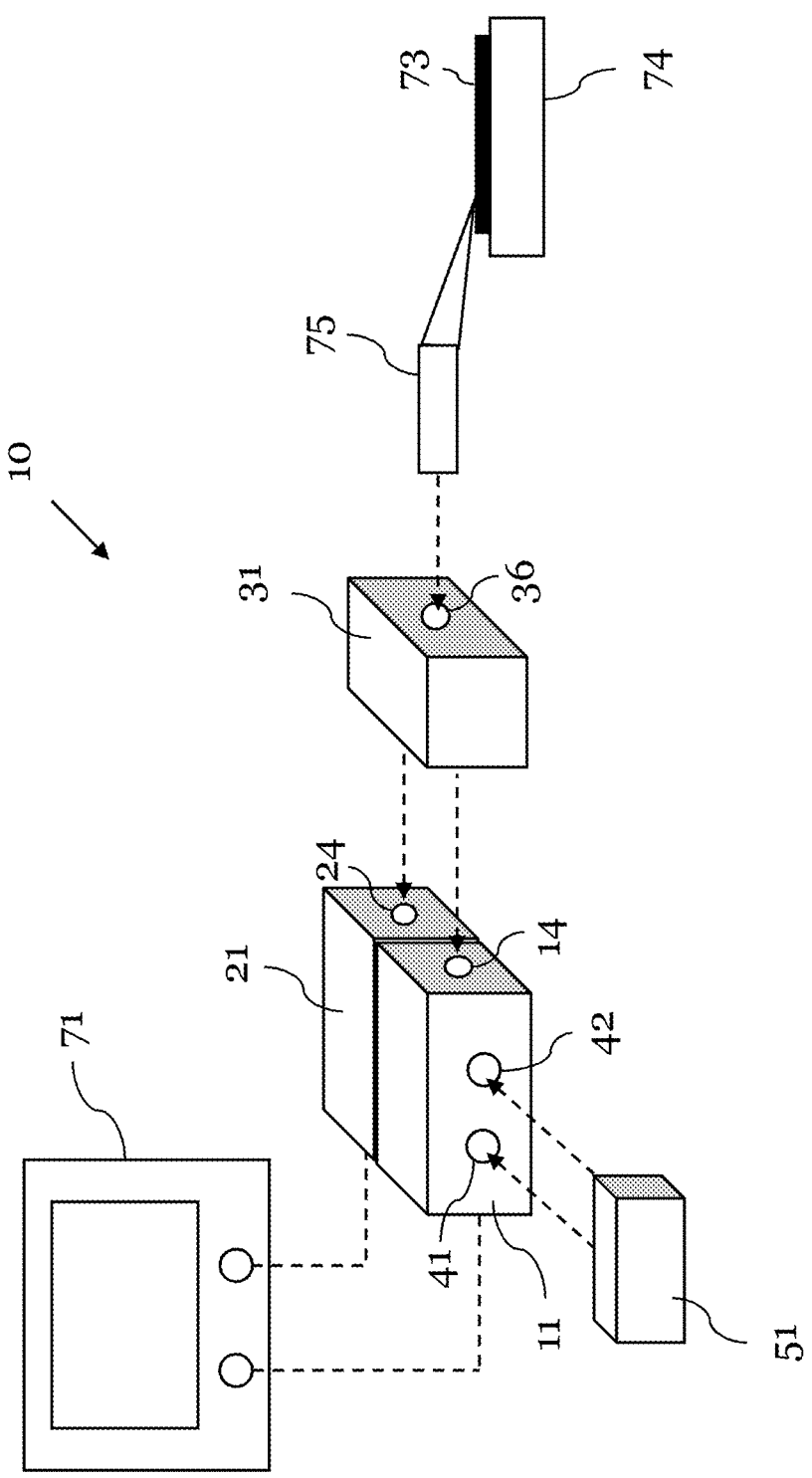
FIG. 4 shows a schematic diagram of a configurable RF system according to an embodiment.

FIG. 4 shows a schematic diagram of the configurable RF system 10 according to an embodiment. Thereby, the RF system 10 is used as a frontend of a test and/or measurement device 72 (e.g., a signal source or signal analyzer) which is used to analyze a DUT on a wafer. The DUT can be an MMIC or thin fil circuit on the wafer 73 which can be placed on a chuck 74 of a wafer prober.

The system shown in FIG. 4 comprises the first and second RF module that are connected to an RF port of the test and/or measurement device 72.

An extension module 51 is connected to at least two auxiliary ports 41, 42 of the first RF module 11. Further both RF modules 11, 21 are connected to the third RF module 31 via their (main) RF ports 14, 24. The third RF module (e.g., an external combiner module for combining RF modules 11 and 21) is in turn connected to the DUT. For instance, third RF module 31 is electrically connected to the DUT via a tip of a wafer prober 75.

All features described above or features shown in the figures can be combined with each other in any advantageous manner within the scope of the invention.

The invention claimed is:

1. A configurable radio frequency, RF, system, comprising:
   a first RF module; and
   a second RF module;
   wherein each of the first and the second RF module comprises:
      an RF circuitry,
      a signal path, in particular a waveguide, and
      an RF port connected to the respective signal path;
   wherein the RF port of the first RF module and the RF port of the second RF module are spaced apart at a predetermined distance and are oriented to enable a connection to a third RF module of the configurable RF system, and
   wherein the RF ports of the first and the second RF module are arranged at the predetermined distance to each other with a tolerance of 100 µm or less.

2. The configurable RF system of claim 1, wherein the respective RF port of the first and/or the second RF module comprises a waveguide flange or a coaxial interface.

3. The configurable RF system of claim 1, wherein the first and/or the second RF module comprise a respective data interface.

4. The configurable RF system of claim 1, wherein the first and/or the second RF module comprise a respective power supply interface.

5. The configurable RF system of claim 1, wherein the third RF module comprises:
   two RF ports which are spaced apart at the predetermined distance and are designed for connecting to the RF ports of the first and the second RF module, and
   a further RF port which is arranged for being connected to a device-under-test, DUT.

6. The configurable RF system of claim 1, wherein the third RF module comprises at least one of: a coupler, a combiner, a splitter, a switch, an impedance tuner, and/or a multiplexer.

7. The configurable RF system of claim 1, wherein the respective RF circuitry of the first and/or the second RF module comprises at least one of: an RF amplifier, an RF mixer, an RF attenuator, an RF switch, an RF isolator, a combiner, a coupler, a doubler, a multiplier, a circulator, a phase shifter, and/or a delay line.

8. The configurable RF system of claim 1,
wherein the first RF module is a receiver module or a transmitter module.

9. The configurable RF system of claim 1,
wherein the second RF module is a receiver module or a transmitter module.

10. The configurable RF system of claim 1,
wherein both the first and the second RF module are receiver modules.

11. The configurable RF system of claim 1,
wherein both the first and the second RF module are transmitter modules.

12. The configurable RF system of claim 1,
wherein the third RF module is detachably attached to the first and the second RF module.

13. The configurable RF system of claim 1,
wherein the third RF module is attached to the first and the second RF module by means of a plug-in connection, a screw connection or a magnetic connection.

\* \* \* \* \*